United States Patent
Luo et al.

(10) Patent No.: US 10,621,908 B2
(45) Date of Patent: Apr. 14, 2020

(54) DISPLAY SUBSTRATE, DISPLAY PANEL, DISPLAY DEVICE AND DISPLAY METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xingyou Luo, Beijing (CN); Yue Li, Beijing (CN); Xi Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/772,500

(22) PCT Filed: Sep. 29, 2017

(86) PCT No.: PCT/CN2017/104305
§ 371 (c)(1),
(2) Date: Apr. 30, 2018

(87) PCT Pub. No.: WO2018/153098
PCT Pub. Date: Aug. 30, 2018

(65) Prior Publication Data
US 2019/0080646 A1 Mar. 14, 2019

(51) Int. Cl.
G09G 3/3225 (2016.01)
G09G 3/36 (2006.01)
(Continued)

(52) U.S. Cl.
CPC ......... G09G 3/3225 (2013.01); G02F 1/1323 (2013.01); G02F 1/133504 (2013.01);
(Continued)

(58) Field of Classification Search
CPC ............. G09G 3/003; G09G 2320/068; G09G 2320/028; G09G 5/14; G02B 27/2214;
(Continued)

(56) References Cited

U.S. PATENT DOCUMENTS 7,794,549 B2    9/2010  Welch et al.
2006/0012593 A1*  1/2006  Iriguchi ................. G09G 3/003
                                                         345/204
(Continued)

FOREIGN PATENT DOCUMENTS

CN       1740850 A     3/2006
CN     101447160 A     6/2009
(Continued)

OTHER PUBLICATIONS

First Office Action issued in Chinese Patent Application No. 201710111077.X, dated Oct. 25, 2018; with English translation.
(Continued)

*Primary Examiner* — Dong Hui Liang
(74) *Attorney, Agent, or Firm* — McDermott Will & Emery LLP

(57) ABSTRACT

A display substrate provided in the embodiments of the present disclosure includes a plurality of display groups repeatedly arranged along a row direction. Each of the plurality of display groups includes n columns of pixel units of different views. For each pixel unit of the n columns of pixel units of different views, a ratio of a length along the row direction to a length along a column direction is 1/n, where n≥2, and n is a positive integer.

5 Claims, 9 Drawing Sheets

(51) Int. Cl.
*G02F 1/1335* (2006.01)
*G02F 1/13* (2006.01)
*G09G 3/00* (2006.01)
*H01L 27/32* (2006.01)

(52) U.S. Cl.
CPC ....... *G02F 1/133512* (2013.01); *G09G 3/003* (2013.01); *G09G 3/3648* (2013.01); *H01L 27/3218* (2013.01)

(58) Field of Classification Search
CPC ............. G02B 27/0172; G02F 1/13363; G02F 1/133526; G02F 1/133553
See application file for complete search history.

(56) References Cited

U.S. PATENT DOCUMENTS

| | | | |
|---|---|---|---|
| 2007/0086090 A1* | 4/2007 | Wang | G02B 27/225 359/464 |
| 2009/0140950 A1* | 6/2009 | Woo | G02B 27/2214 345/4 |
| 2009/0262418 A1 | 10/2009 | Yun et al. | |
| 2013/0155034 A1 | 6/2013 | Nakayama et al. | |
| 2015/0338666 A1 | 11/2015 | Zhou et al. | |
| 2016/0161754 A1 | 6/2016 | Hyodo et al. | |
| 2016/0267859 A1 | 9/2016 | Lin et al. | |
| 2017/0154555 A1 | 6/2017 | Wei | |

FOREIGN PATENT DOCUMENTS

| | | |
|---|---|---|
| CN | 103163683 A | 6/2013 |
| CN | 103247665 A | 8/2013 |
| CN | 104102043 A | 10/2014 |
| CN | 104503116 A | 4/2015 |
| CN | 104978941 A | 10/2015 |
| CN | 205541690 U | 8/2016 |
| CN | 106875852 A | 6/2017 |
| WO | 2007/034618 A1 | 3/2007 |

OTHER PUBLICATIONS

International Search Report and Written Opinion issued in International Application No. PCT/CN2017/104305 dated Dec. 29, 2017 (with English translation).

* cited by examiner image information of an image to be displayed is acquired, wherein the image information includes image data of n views — S100 the image data of n views is correspondingly input to n columns of pixel units of the display device — S101

DISPLAY SUBSTRATE, DISPLAY PANEL, DISPLAY DEVICE AND DISPLAY METHOD THEREOF

RELATED APPLICATIONS

This application is the U.S. National Phase under 35 U.S.C. § 371 of International Patent Application No. PCT/CN2017/104305, filed on Sep. 29, 2017, which in turn claims priority to Chinese Patent Application No. 201710111077.X filed on Feb. 27, 2017, titled "DISPLAY SUBSTRATE, DISPLAY PANEL, DISPLAY DEVICE AND DISPLAY METHOD THEREOF", which are incorporated herein by reference in their entirety.

TECHNICAL FIELD

The present disclosure relates to the field of multi-view display technology, and more particularly, to a display substrate, a display panel, a display device and a display method thereof.

BACKGROUND

With a development of the display technology, in order to meet the needs of different groups and interests of consumers viewing the display screen from different views to get different display screen information, thereby enhancing a unique visual experience, multi-view (for example: dual view, tri view or the like) display devices have also emerged.

Taking a dual view display device as an example, a dual view display technology refers to a display technology which can see different pictures from different positions with respect to the display screen at the same time. This dual view display technology usually adopts a parallax barrier method. Using light-shielding stripes of a light-shielding layer (a grating) of the dual view, one sub-pixel may only be seen by one of the observers on left side or right side of the dual view display device, ultimately enabling one observer on the left side of the dual view display device to see a part of pixels and another one observer on the right side to see another part of the pixels. Picture information seen from the left side and right side is usually different, thereby realizing a dual view display. The dual view display device includes a dual view display panel located at a bottom and a dual view grating located at a top. As shown in FIG. 1(a), the dual view display panel is composed of dual view pixel units 11 arranged in an array. Specifically, the dual view pixel units 11 are composed of right view pixel units 112 and left-view pixel units 111 which are arranged in two adjacent columns.

However, existing dual view display panels all have a serious problem. As shown in FIGS. 1(a) and 1(b), a length of a pixel unit 10 of the dual view display panel and a common display panel in the prior art along a row direction are equal to a length of the pixel unit 10 of the dual view display panel and a common display panel in the prior art along a column direction. For the dual view display panel and the common display panel of which sizes are same, if the pixel unit have the same size, a number of the dual view pixel units 11 of the dual view display panel is half of a number of the pixel units 10 of the common display panel since the number of pixel units arranged in a same row is same. That is, a number of left view pixel units 111 or a number of right view pixel units 112 in the same row is half of the number of the pixel units 10 in the common display panel. Therefore, it will lead to a distortion of the display picture of the left view or the right view, if the image information in the common display panel is input to the left view pixel units 111 or the right view pixel units 112. In order to ensure that display image is not distorted, a half of the image information in the common display panel is needed to be removed, which will result in a resolution of a left view display image or a right view display image is reduced to a half of a resolution of a common display image, thereby greatly reducing an image quality of the dual view display.

SUMMARY

Some embodiments of the present disclosure provide a display substrate, a display panel, a display device and a display method thereof, which is capable of avoiding a distortion of a display image without reducing a resolution of the display image.

In order to achieve this objective, the embodiments of the present disclosure adopt the following technical solutions.

In a first aspect, a display substrate is provided. The display substrate includes: a plurality of display groups arranged one by one along a row direction, wherein each of the plurality of display groups includes n columns of pixel units of different views, and for each pixel unit of the n columns of pixel units of different views, a ratio of a length along the row direction to a length along a column direction is 1/n; where n$\geq$2, and n is a positive integer.

Optionally, when n is 2, each of the plurality of display groups includes one column of left view pixel units and one column of right view pixel units; wherein, for each left view pixel unit of the one column of left view pixel units, a ratio of a length along the row direction to a length along the column direction is ½; and for each right view pixel unit of the one column of the right view pixel units, a ratio of a length along the row direction to a length along the column direction is ½.

Optionally, when n is 3, each of the plurality of display groups includes one column of left view pixel units, one column of right view pixel units and one column of front view pixel units which are sequentially arranged along the row direction; wherein for each left view pixel unit of the one column of left view pixel units, a ratio of a length along the row direction to a length along the column direction is ⅓; for each right view pixel unit of the one column of right view pixel units, a ratio of a length along the row direction to a length along the column direction is ⅓; and for each front view pixel unit of the one column of front view pixel units, a ratio of the length along the row direction to the length along the column direction is ⅓.

Optionally, the each pixel unit of the n columns of pixel units of different views includes a first primary color sub-pixel unit, a second primary color sub-pixel unit and a third primary color sub-pixel unit which are sequentially arranged along the column direction; wherein, colors of a same row of sub-pixel units of the each of the plurality of display groups are same.

In a second aspect, a display panel is provided. The display panel includes the display substrate described in the first aspect.

Optionally, the display panel is a liquid crystal display panel or an organic light-emitting diode display panel.

In a third aspect, a display device is provided. The display device includes a display panel and a grating disposed on a light emitting side of the display panel, wherein the grating includes light shielding regions and light transmitting regions which are sequentially and alternately arranged along a row direction, and the display panel is the display panel provided in the second aspect.

Optionally, when n is 2, each of a plurality of display groups corresponds to one of the light transmitting regions of the grating, and the one of the light transmitting regions is located at a boundary position between one column of left view pixel units and one column of right view pixel units.

Further optionally, the one of the light transmitting regions is located at a middle position of a corresponding display group of the display groups, and along a column direction, an orthogonal projection of a centerline of the one of the light transmitting regions on the display panel is overlapped with an orthogonal projection of a centerline of the one of the plurality of display groups corresponding display group on the display panel; and a viewing angle $\varphi_0$ of a left view and a right view meets a formula of:

$$90° - \arcsin\left\{n_0 \times \sin\left[\arctan\left(\frac{3m + 2p - a}{2h}\right)\right]\right\} <$$

$$\varphi_0 < 90° - \arcsin\left\{n_0 \times \sin\left[\arctan\left(\frac{a - m}{2h}\right)\right]\right\};$$

where, "a" is a length of the one of the light transmitting regions along the row direction, "p" is a length of an aperture region of a pixel unit along the row direction, m is a length between two adjacent aperture regions along the row direction, "h" is a thickness of a base substrate adjacent to the grating of the display panel, and "$n_0$" is a refractive index of the base substrate adjacent to the grating of the display panel.

Optionally, when "n" is 3, within two adjacent light transmitting regions among the light transmitting regions, one light transmitting region is located at a boundary position between one column of left view pixel units and one column of right view pixel units, and another light transmitting region is located at a middle position of one column of front view pixel units.

Further optionally, within the two adjacent light transmitting regions among the light transmitting regions, an orthogonal projection of a centerline of the one light transmitting region on the display panel is overlapped with an orthogonal projection of a centerline between the one column of left view pixel units and the one column of right view pixel units along the column direction on the display panel, and an orthogonal projection of a centerline of the another light transmitting region on the display panel is overlapped with an orthogonal projection of a centerline between the one column of front view pixel units along the column direction on the display panel and a viewing angle $\varphi_1$ of a left view and a right view meets a formula of:

$$90° - \arcsin\left\{n_0 \times \sin\left[\arctan\left(\frac{2p_1 + m_1 + a_1}{2h}\right)\right]\right\} <$$

$$\varphi_1 < 90° - \arcsin\left\{n_0 \times \sin\left[\arctan\left(\frac{m_1 - a_1}{2h}\right)\right]\right\}; \text{ where,}$$

$$\frac{2m_2 + p_2 - a_2}{2h} \geq \tan\left[\arcsin\left(\frac{1}{n_0}\right)\right], \frac{2m_2 + 2p_1 + m_1 - a_1}{2h} \geq \tan\left[\arcsin\left(\frac{1}{n_0}\right)\right],$$

and $m_1 - a_1 - p_2 - a_2 \geq 0$, where "$p_1$" is a length of an aperture region of one left view pixel unit of the one column of left view pixel units or one right view pixel unit of the one column of right view pixel units along a row direction, "$p_2$" is a length of an aperture region of one front view pixel unit of the one column of front view pixel units along the row direction, $m_1$ is a length between an aperture region of the one left view pixel unit of the one column of left view pixel units and an aperture region of the one right view pixel unit of the one column of right view pixel units along the row direction, wherein the one left view pixel unit of the one column of left view pixel units is adjacent to the one right view pixel unit of the one column of right view pixel units; "$m_2$" is a length between an aperture region of the one left view pixel unit of the one column of left view pixel units and an aperture region of the one front view pixel unit of the one column of front view pixel units along the row direction, wherein the one left view pixel unit is adjacent to the front view pixel unit, or "$m_2$" is a length between an aperture region of the one right view pixel unit of the one column of right view pixel units and an aperture region of the one front view pixel unit of the one column of front view pixel units along the row direction, wherein the one right view pixel unit is adjacent to the front view pixel unit; "$a_1$" is a length of the one light transmitting region along the row direction at the boundary position between the one column of left view pixel units and the one column of right view pixel units, and "$a_2$" is a length of the another light transmitting region along the row direction at the middle position of one front view pixel unit of the one column of front view pixel units; "h" is a thickness of a base substrate adjacent to the grating of the display panel, and "$n_0$" is a refraction rate of the base substrate adjacent to the grating of the display panel.

In a fourth aspect, a display method of the display device provided in the third aspect is provided. The display method includes; acquiring an image information of an image which is to be displayed, wherein the image information includes an image data of n views; and inputting the image data of the n views into n columns of pixel units of different views of the display device correspondingly.

BRIEF DESCRIPTION OF THE DRAWINGS

In order to describe technical solutions in embodiments of the present disclosure more clearly, the drawings to be used in the description of embodiments will be introduced briefly. Obviously, the drawings to be described below are merely some embodiments of the present disclosure, and a person of common skill in the art can obtain other drawings according to those drawings without paying any creative effort.

DETAILED DESCRIPTION

The technical solutions in the embodiments of the present disclosure will be described clearly and completely with reference to the drawings in the embodiments of the present disclosure. Obviously, the described embodiments are merely some but not all of embodiments of the present disclosure. All other embodiments made on the basis of the embodiments of the present disclosure by a person of common skill in the art without paying any creative effort shall be included in the protection scope of the present disclosure.

Figure 1:
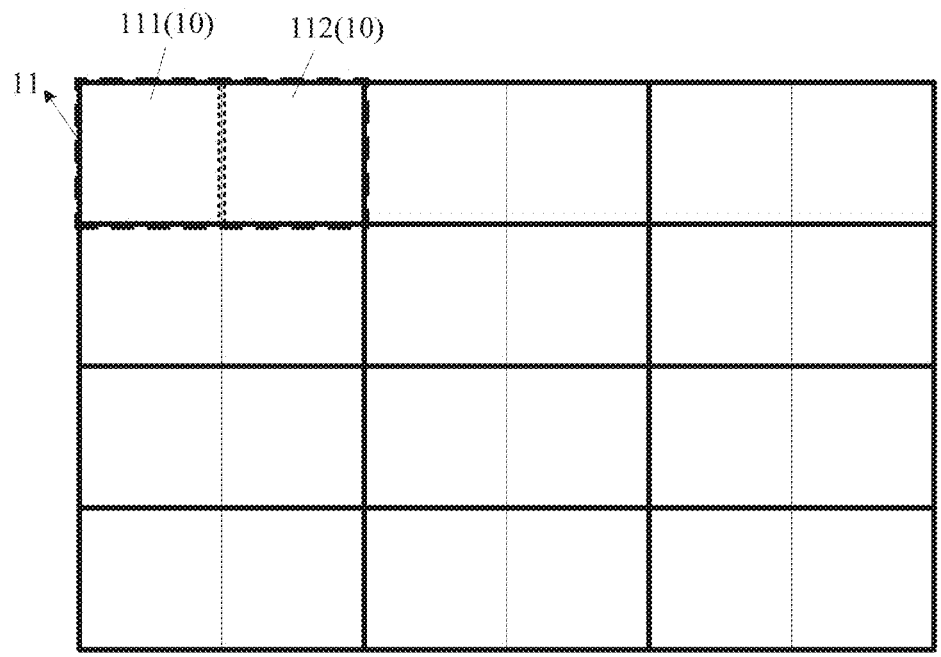
FIG. 1(a) is a structural diagram of a dual view display panel provided in the prior art.
FIG. 1(b) is a structural diagram of a common display panel provided in the prior art.
Figure 1:
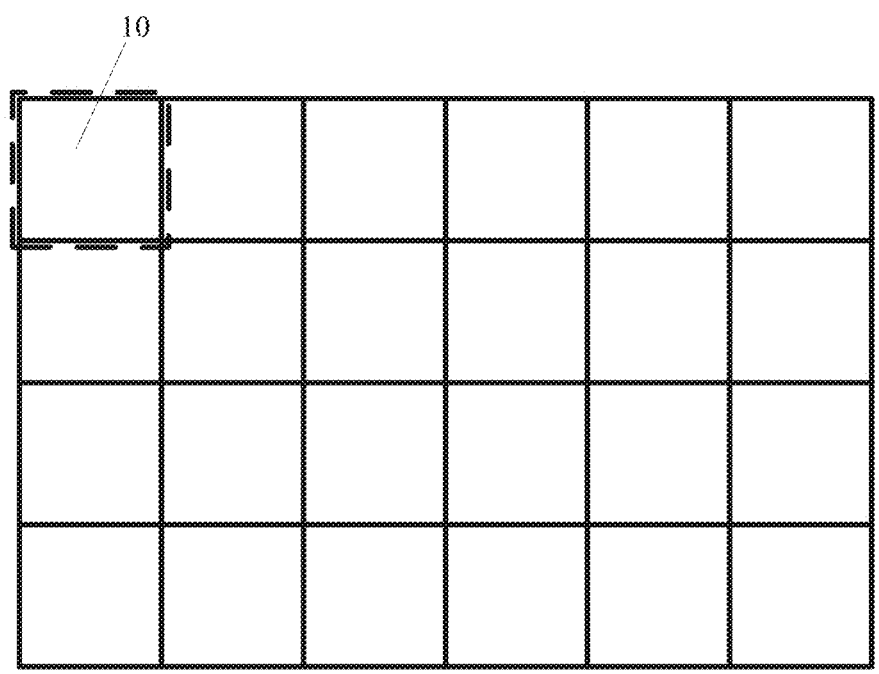
Figure 2:
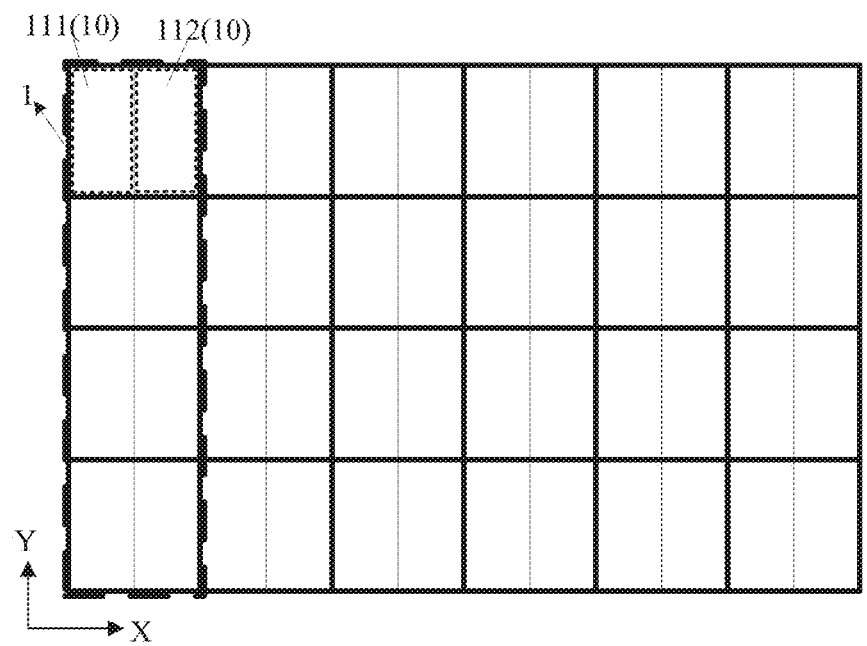
FIG. 2(a) is a structural diagram of a dual view display substrate provided in some embodiments of the present disclosure.
FIG. 2(b) is a structural diagram of a tri view display substrate provided in some embodiments of the present disclosure.
Figure 2:
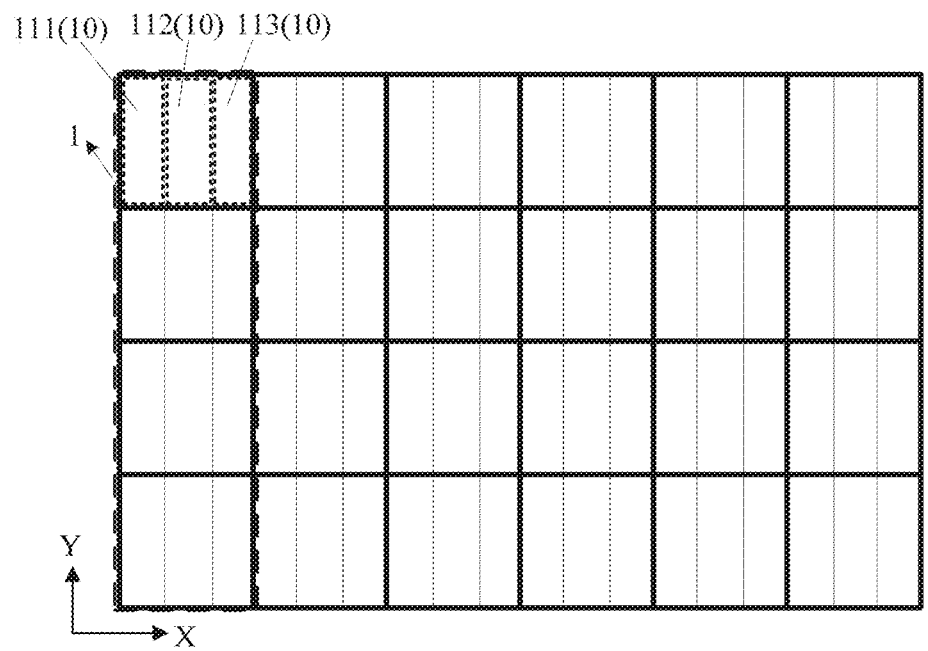
Figure 3:
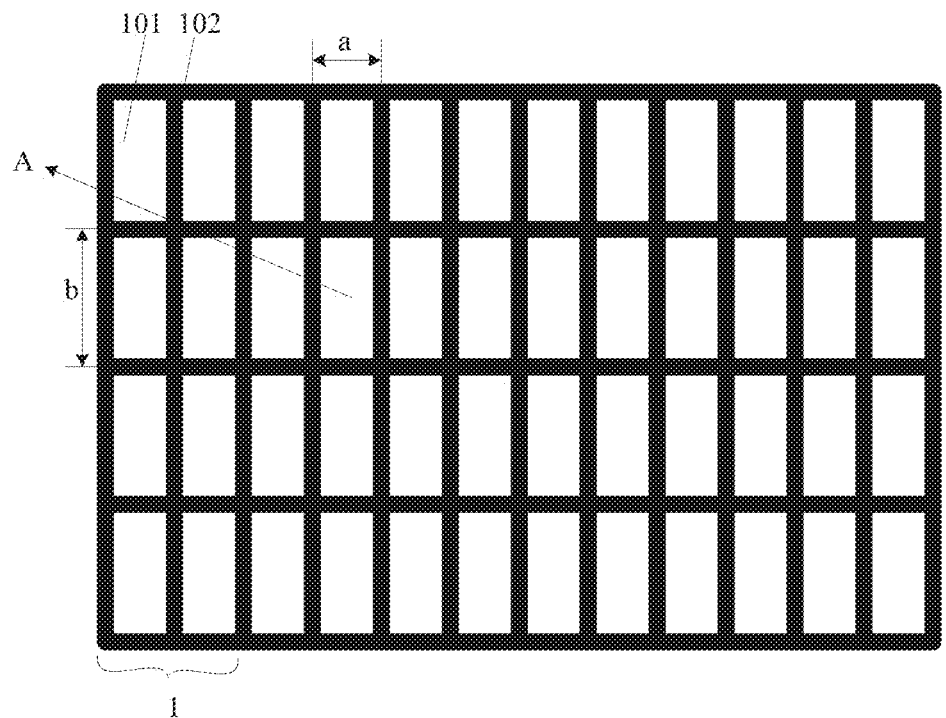
FIG. 3(a) is a first structural diagram of a display panel in which each of the display groups includes 2 columns of pixel units of different views provided in some embodiments of the present disclosure.
FIG. 3(b) is a second structural diagram of a display panel in which each of the display groups includes 2 columns of pixel units of different views provided in some embodiments of the present disclosure.
FIG. 3(c) is a third structural diagram of a display panel in which each of the display groups includes 2 columns of pixel units of different views provided in some embodiments of the present disclosure.
FIG. 3(d) is a fourth structural diagram of a display panel in which each of the display groups includes 2 columns of pixel units of different views provided in some embodiments of the present disclosure.
Figure 3:
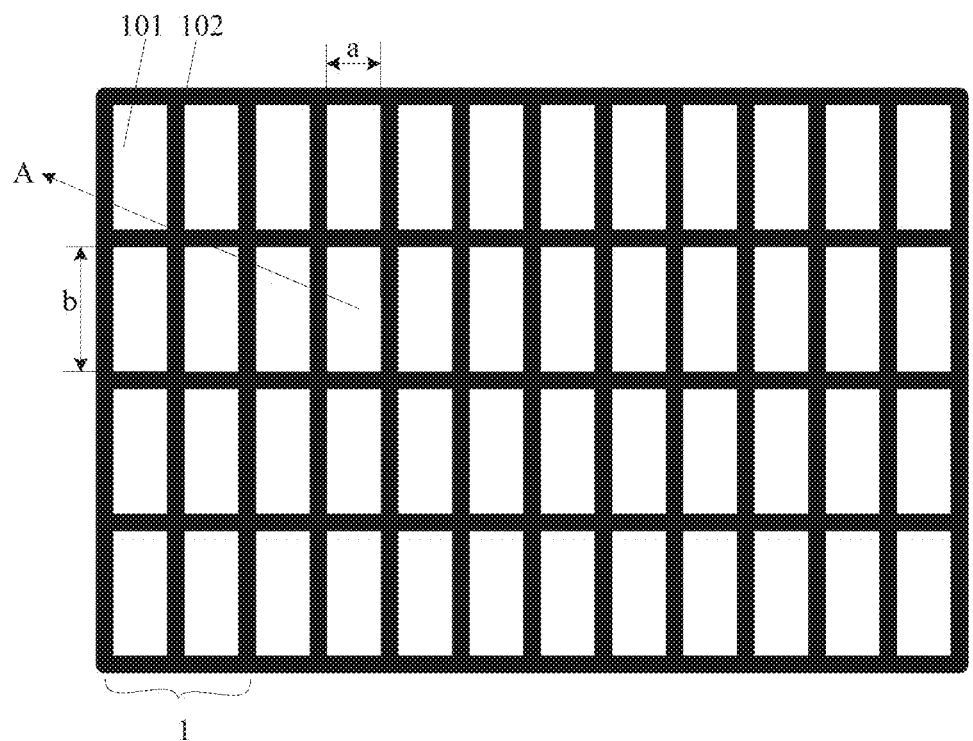
Figure 3:
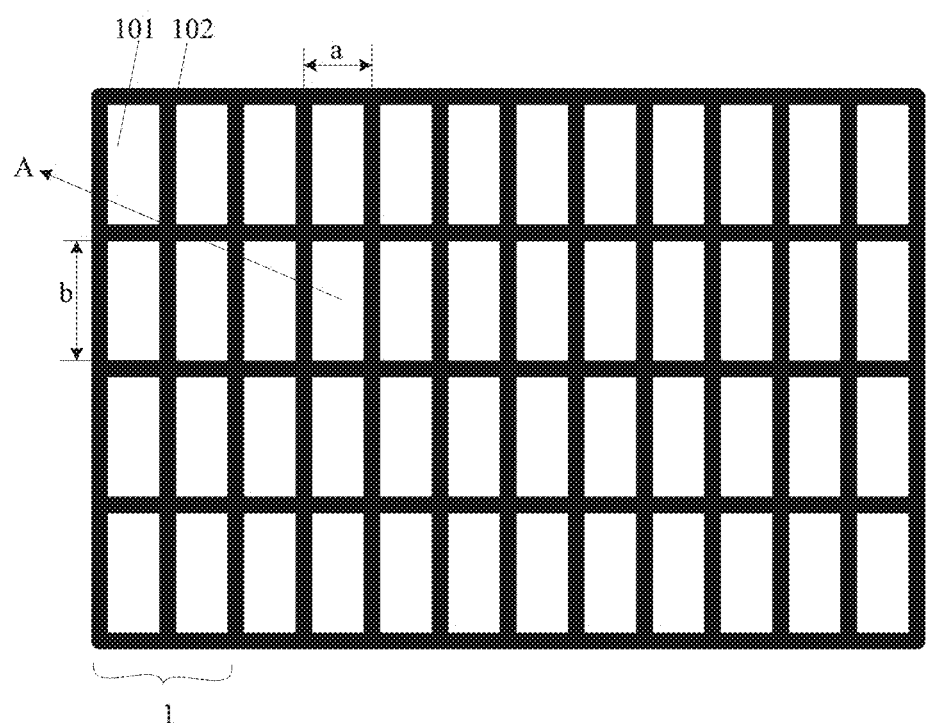
Figure 3:
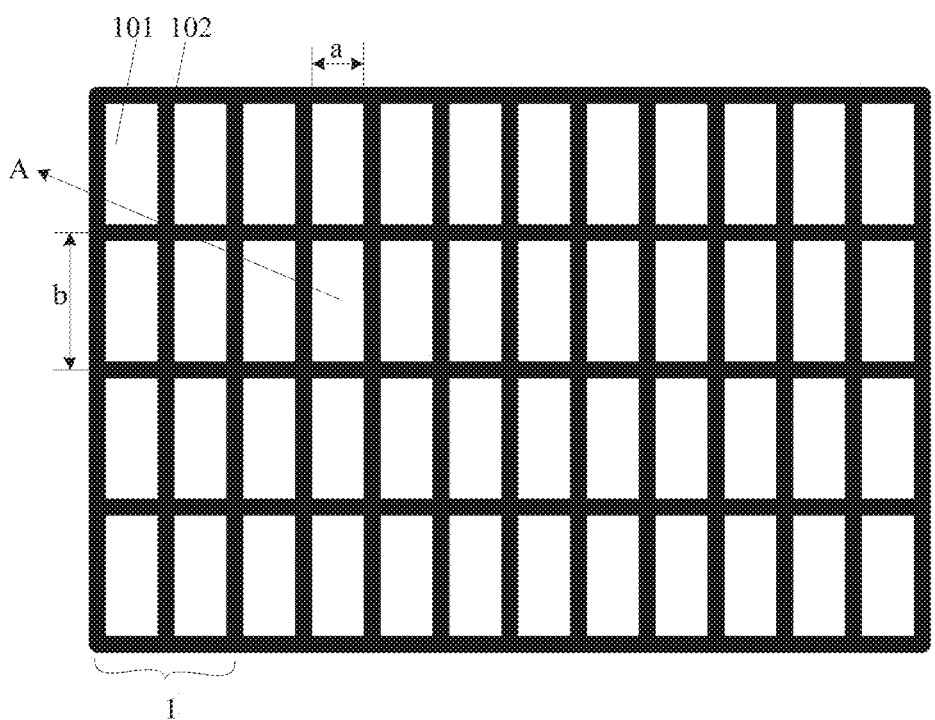

Some embodiments of the present disclosure provide a display substrate. As shown in FIGS. 2(a) and 2(b), the display substrate includes a plurality of display groups 1 which are repeatedly arranged along a row direction X, and each of the plurality of display groups 1 includes n columns of pixel units 10 of different views. For each pixel unit of the n columns of pixel units 10 of the different views, a ratio of a length a along the row direction X (as shown in FIG. 3(a)) to a length b along a column direction Y is 1/n; where n$\geq$2, and n is a positive integer.

The following embodiments and drawings in the present disclosure are described by taking the row direction X being a horizontal direction and the column direction Y being a vertical direction as an example. In addition, directional terms "row direction X" and "column direction Y" are defined with respect to the orientation in which the display substrate is placed in the drawings. It should be understood that these directional terms are relative concepts and they are used to the description and clarification of "relative to". Therefore, the above orientation may be changed according to a change of the orientation of the display substrate.

It should be noted that, firstly, as shown in FIG. 2(a), upon each of the plurality of display groups 1 includes 2 columns of pixel units 10 of different views (for example, a left view pixel unit 111 and a right view pixel unit 112). The display substrate is a dual view display substrate. As shown in FIG. 2(b), upon each of the display groups 1 includes 3 columns of pixel units 10 of different views (for example, the left view pixel unit 111, the right view pixel unit 112 and a front view pixel unit 113), the display substrate is a tri view display substrate. Followed by analogy, it is unnecessary to go into details here.

Secondly, the display substrate may be an array substrate of an LCD (Liquid Crystal Display) or a color film substrate of an LCD. The array substrate of the LCD may be a common substrate or a COA substrate (Color filter on Array, a color film is integrated on the array substrate); of course, the display substrate may also be an array substrate of an OLED (Organic Light-Emitting Diode) display.

Based on this, as shown in FIGS. 3(a), 3(b), 3(c) and 3(d) (FIGS. 3(a) to 3(d) illustrates an example in which each of the plurality of display groups 1 includes 2 columns of pixel units 10 of different views). For each kind of display substrate, each of the pixel units 10 may include an aperture region 101 and a non-aperture region 102, and may also include only an aperture region 101. Upon each of the pixel units 10 includes the aperture region 101 and the non-aperture region 102, for one of the pixel units 10, one half of the non-aperture region 102 between the adjacent aperture regions 101 belongs to one of the pixel units 10, and another half of the non-aperture region 102 between the adjacent aperture regions 101 belongs to another one of the pixel unit 10 adjacent to the one of the pixel units 10, and a size of each of the pixel units 10 of the display substrate is same.

For the display substrate of an LCD, the non-aperture region 102 refers to a non-light transmitting region; for a display substrate in an OLED display, the non-aperture region 102 refers to a non-light emitting region.

Based on the above, a calculation method of the length a along the row direction X and the length b along the column direction Y of each of the pixel units 10 is not limited. Specifically, taking a pixel unit A in FIG. 3(a) as an example, the length a of the pixel unit 10 along the row direction X is a sum of a length of the aperture region 101 along the row direction X and a half of lengths of two non-aperture regions 102 adjacent to the aperture region 101 along the row direction X, and the length b of the pixel unit 10 along the column direction Y is a sum of a length of the aperture region 101 along the column direction Y and half of lengths of two non-aperture regions 102 adjacent to the aperture region 101 along the column direction Y. Alternatively, taking a pixel unit A in FIG. 3(b) as an example, the length a of the pixel unit 10 along the row direction X is the length of the aperture region 101 along the row direction X, and the length b of the pixel unit 10 along the column direction Y is the length of the aperture region 101 along the column direction Y. Alternatively, taking a pixel unit A of FIG. 3(c) as an example, the length a of the pixel unit 10 along the row direction X is a sum of a length of aperture region 101 along the row direction X and a half of lengths of two non-aperture regions 102 adjacent to the aperture region 101 along the row direction X, and the length b of the pixel unit 10 along the column direction Y is the length of the aperture region 101 along the column direction Y. Alternatively, taking the pixel unit A in FIG. 3(d) as an example, the length a of the pixel unit 10 along the row direction X is the length of the aperture region 101 along the row direction X, and the length b of the pixel unit 10 along the column direction Y is a sum of a length of aperture region 101 along the column direction Y and a half of lengths of two non-aperture regions 102 adjacent to the aperture region 101 along the column direction Y.

Here, for each of the pixel units 10, the ratio of the length a of along the row direction X to the length b along the column direction Y is equal to 1/n or approximately equal to 1/n, which are within the protection scope of the embodiments of the present disclosure.

Thirdly, the pixel units 10 in a same column are visible in a same view. The number of pixel units 10 included in one column of the pixel units 10 is not limited, and may be set according to a size of the display substrate.

Fourthly, a number and an arrangement of sub-pixel units of each of the pixel units 10 are not limited. For example, each of the pixel units 10 may include three sub-pixel units. The three sub-pixel units may be sequentially arranged along the column direction, or may be sequentially arranged along the row direction, and may also be sequentially arranged in a font of " 品 ".

The embodiments of the present disclosure provide the display substrate. Since each of the plurality of display groups 1 includes n columns of pixel units 10 of different views, and for each pixel unit of the n columns of pixel units of different views, the ratio of the length a X along the row direction to the length b along the column direction Y of each of the pixel units 10 is 1/n, the length of each of the pixel units 10 of a common display substrate along the row direction X is equal to the length of each of the pixel units 10 of the common display substrate along the column direction Y, for the display substrate and the common display substrate which are having the same size, the length of each of the plurality of display groups 1 along the row direction X is equal to the length of each of the pixel units 10 of the common display substrate along the row direction X. In this way, along the row direction X, a number of the plurality of display groups 1 that can be set on the display substrate is equal to a number of the pixel units 10 which that can be set on the common display substrate. That is, in the embodiments of the disclosure, the number of the pixel units 10 of each of the different views along the row direction X is equal to the number of the pixel units 10 of the common display substrate along the row direction X. Thus, if the image information of the common display panel is input to one of the pixel units 10 of any one of the different views, no distortion will occur in a displayed image, and a resolution of the displayed image will not reduce.

Optionally, as shown in FIG. 2(a), when n is 2, each of the plurality of display groups 1 includes one column of left view pixel units 111 and one column of right view pixel units 112. For each left view pixel unit of the one column of the left view pixel units 111, a ratio of the length a along the row direction X to the length b along the column direction Y is ½; and for each right view pixel unit of the one column of the right view pixel units 112, a ratio of the length a along the row direction X to the length b along the column direction Y is ½.

When n is 2, the display substrate is a dual view display substrate.

In some embodiments of the present disclosure, for each left view pixel unit of the one column of the left view pixel units 111 and for each right view pixel unit of the one column of the right view pixel units 112, a ratio of the length a along the row direction X to the length b along the column direction Y is ½. For each of the pixel units 10 of a common display substrate, the length along the row direction X is equal to the length along the column direction Y. Therefore, for the dual view display substrate and the common display substrate which are having a same size, a number of the pixel units 10 that can be set along the row direction X of the dual view display substrate is twice of a number of the pixel units 10 that can be set along the row direction X of the common display substrate. That is, a number of the left view pixel units 111 or a number of the right view pixel units 112 that can be set along the row direction X of the dual view display substrate is equal to the number of the pixel units 10 that can be set along the row direction X of the common display substrate, so the displayed image will not be distorted, and the resolution of the displayed image will not reduce if the image information of the common display panel is input to the left view pixel units 111 or to the right view pixel units 112.

Optionally, as shown in FIG. 2(b), when n is 3, each of the plurality of the display groups 1 includes a column of left view pixel units 111, a column of right view pixel units 112 and a column of front view pixel units 113 in sequence along the row direction X. For each left view pixel unit of the one column of left view pixel units 111, a ratio of the length a along the row direction X to the length b along the column direction Y is ⅓. For each right view pixel unit of the one column of right view pixel units 112, a ratio of the length a along the row direction X to the length b along the column direction Y is ⅓. And for each front view pixel unit of the one column of front view pixel units 113, a ratio of the length a along the row direction X to the length b along the column direction Y is ⅓.

When n is 3, the display substrate is a tri view display substrate.

In some embodiments of the present disclosure, for each left view pixel unit of the one column of left view pixel units 111, for each right view pixel unit of the one column of right view pixel units 112, and for each front view pixel unit of the one column of front view pixel units 113, a ratio of the length a to the length b along the row direction X is ⅓, and for each of the pixel units 10 of a common display substrate, the length along the row direction X is equal to the length along the column direction Y. Therefore, for the tri view display substrate and the common display substrate which are having a same size, a number of the pixel units 10 that can be set along the row direction X of the tri view display substrate is three times of the number of the pixel units 10 that can be set along the row direction X of the common display substrate. That is, a number of the left view pixel units 111, a number of the right view pixel units 112 and a number of the front view pixel units 113 that can be set along the row direction X of the tri view display substrate are all equal to the number of the pixel units 10 that can be set along the row direction X of the common display substrate. Thus, the displayed image will not be distorted and the resolution of the displayed picture will not reduce, if the image information of the common display panel is input to the left view pixel units 111, to the right view pixel units 112 or to the front view pixel units 113.

Figure 4:
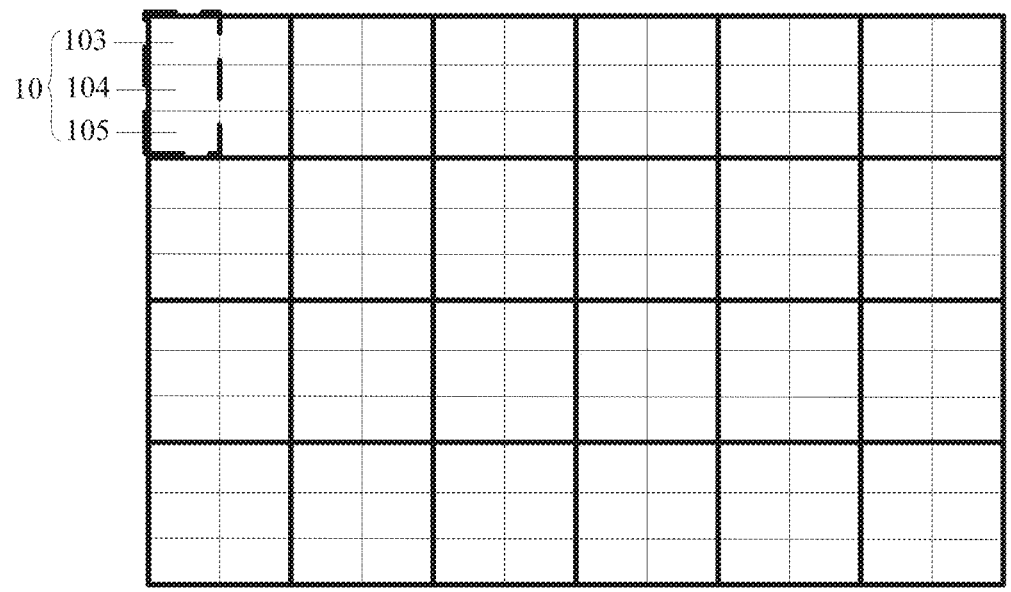
FIG. 4 is a structural diagram of a dual view display substrate in which a pixel unit includes three sub-pixel units provided in some embodiments of the present disclosure.

Optionally, as shown in FIG. 4 (in FIG. 4, it takes each of the plurality of display groups 1 including 2 columns of pixel units of different views as an example), each pixel unit 10 of the n columns of pixel units 10 of different views includes: a first primary color sub-pixel unit 103, a second primary color sub-pixel unit 104 and a third primary color sub-pixel unit 105 which are sequentially arranged along the column direction. Colors of a same row of sub-pixel units of each of the display groups 1 are same.

A first primary color, a second primary color and a third primary color are not limited. The first primary color, the second primary color and the third primary color may be respectively red, green and blue, or may be respectively magenta, yellow and cyan.

It should be noted that, since the plurality of display groups 1 of the display substrate are repeatedly arranged along the row direction, colors of the sub-pixel units arranged in a same row of the display substrate are same if colors of the sub-pixel units arranged in the same row of each of the plurality of display groups 1 are the same.

According to some embodiments of the present disclosure, in a multi-view display, light transmitting regions of the grating are sequentially arranged along the row direction X, and each of the light transmitting regions extends along the column direction Y. If the first primary color sub-pixel unit 103, the second primary color sub-pixel unit 104 and the third primary color sub-pixel unit 105 of the pixel unit 10 are sequentially arranged along the row direction X or are arranged in other ways, a light emitted from a sub-pixel unit closest to the light transmitting regions is the most, and the light emitted from a sub-pixel unit farthest from the light transmitting regions is the least, thereby the light of the above three primary color sub-pixel units emitted from the light transmitting regions will be uneven, which will affect the display effect. In addition, it also increases a difficulty of designing the display substrate color specifications. Based on this, in some embodiments of the present disclosure, the first primary color sub-pixel unit 103, the second primary color sub-pixel unit 104 and the third primary color sub-pixel units 105 in each of the pixel units 10 are sequentially arranged along the column direction Y, so that the light of the above three primary color sub-pixel units emitted from the light transmitting regions will be even, which will not affect the display effect. In addition, the colors of the sub-pixel units arranged in the same row of each of the plurality of display groups 1 are the same, thereby the manufacturing process of the display substrate may be simplified.

Some embodiments of the present disclosure provide a display panel including the display substrate described above.

A type of the display panel is not limited, and for example, the display panel may be a liquid crystal display (LCD) panel or an organic light-emitting diode (OLED) display panel.

In a case in which the display panel is the liquid crystal display panel, the liquid crystal display panel includes an array substrate, a color film substrate and a liquid crystal layer disposed between the array substrate and the color film substrate. The array substrate includes a thin film transistor and a pixel electrode. The thin film transistor includes a source, a drain, an active layer, a gate and a gate insulating layer, wherein the drain is electrically connected to the pixel electrode. Based on this, the display panel further includes the color film substrate upon the display substrate is the array substrate; and the display panel further includes the array substrate upon the display substrate is the color film substrate.

In a case in which the display panel is an organic light-emitting diode display panel, the organic light-emitting diode display panel includes an array substrate and an encapsulation substrate. The array substrate includes an anode, a cathode and a light emitting layer. In a case in which the organic light-emitting diode display panel is an active matrix organic light-emitting diode display panel, the array substrate further includes a thin film transistor, wherein a drain of the thin film transistor is electrically connected to the anode. In this case, the above display substrate is an array substrate.

The embodiments of the present disclosure provide the display panel. Since the display substrate of the display panel includes a plurality of display groups 1 arranged along a row direction, wherein each of the plurality of display groups 1 includes n columns of pixel units 10 of different views, and for each pixel unit of the n columns of pixel units of different views, a ratio of a length a along the row direction X to a length b along the column direction Y is 1/n, and the length of each of the pixel units 10 of a common display substrate along the row direction X is equal to the length of each of the pixel units 10 of the common display substrate along the column direction Y. Therefore, for the display substrate and the common display substrate which are having the same size, the length of each of the plurality of display groups 1 along the row direction X is equal to the length of each of the pixel units 10 of the common display substrate along the row direction X. In this way, along the row direction X, a number of the plurality of display groups 1 that can be set on the display substrate is equal to a number of the pixel units 10 that can be set on the common display substrate. That is, in the embodiments of the disclosure, the number of the pixel units 10 of each of the different views along the row direction X is equal to the number of the pixel units 10 of the common display substrate along the row direction X. Thus, if the image information of the common display panel is input to one of the pixel units 10 of any one of the different views, no distortion will occur in a displayed image, and a resolution of the displayed image will not reduce.

Some embodiments of the present disclosure provide a display device. As shown in FIGS. 5(a), 5(b), 6(a) and 6(b), the display device includes a display panel 2 and a grating 3 disposed on a light emergent side of the display panel 2. The grating includes light shielding regions 31 and light transmitting regions 32 which are sequentially and alternately arranged along a row direction. The display panel 2 is the above-mentioned display panel.

Figure 5A:
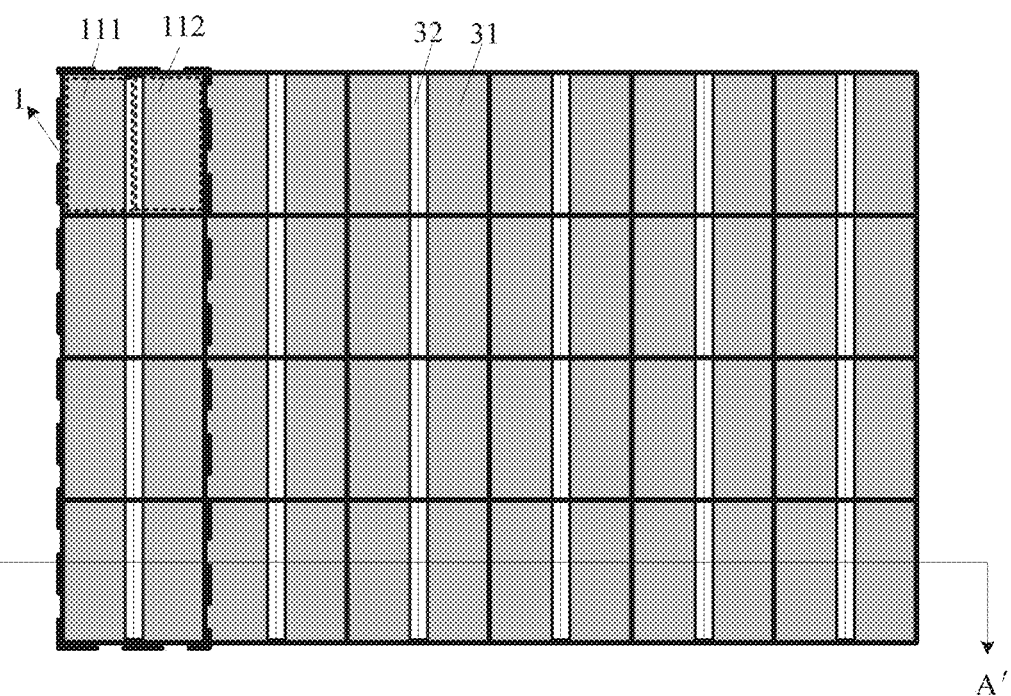
FIG. 5(a) is a structural diagram of a dual view display device provided in some embodiments of the present disclosure.
Figure 5B:
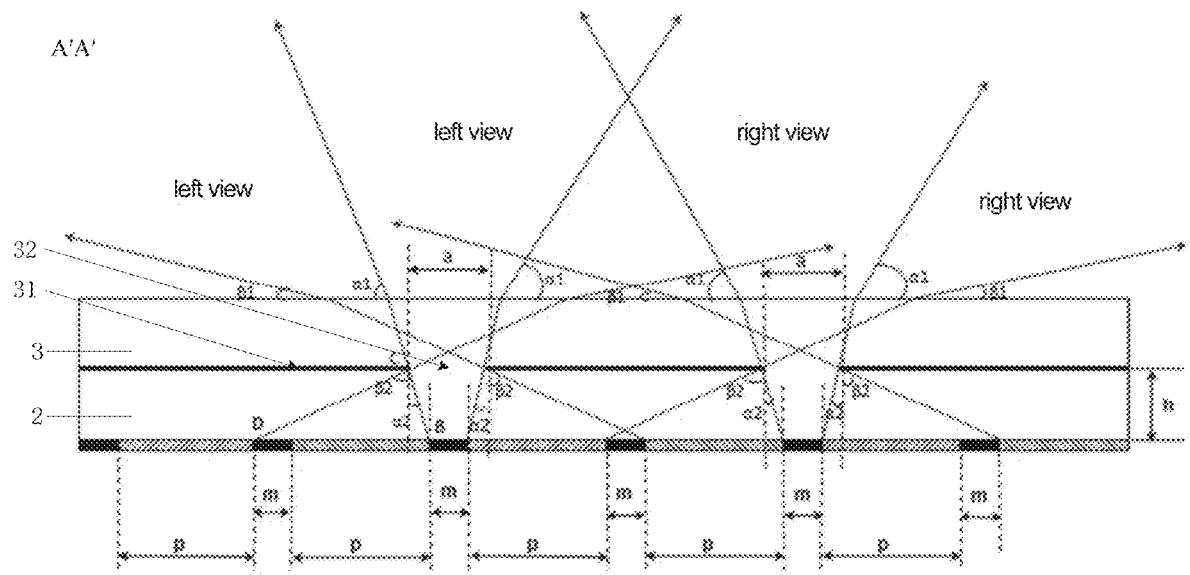
FIG. 5(b) is an optical path diagram corresponding to the cross-sectional view in an A'A' direction of FIG. 5(a)
Figure 6A:
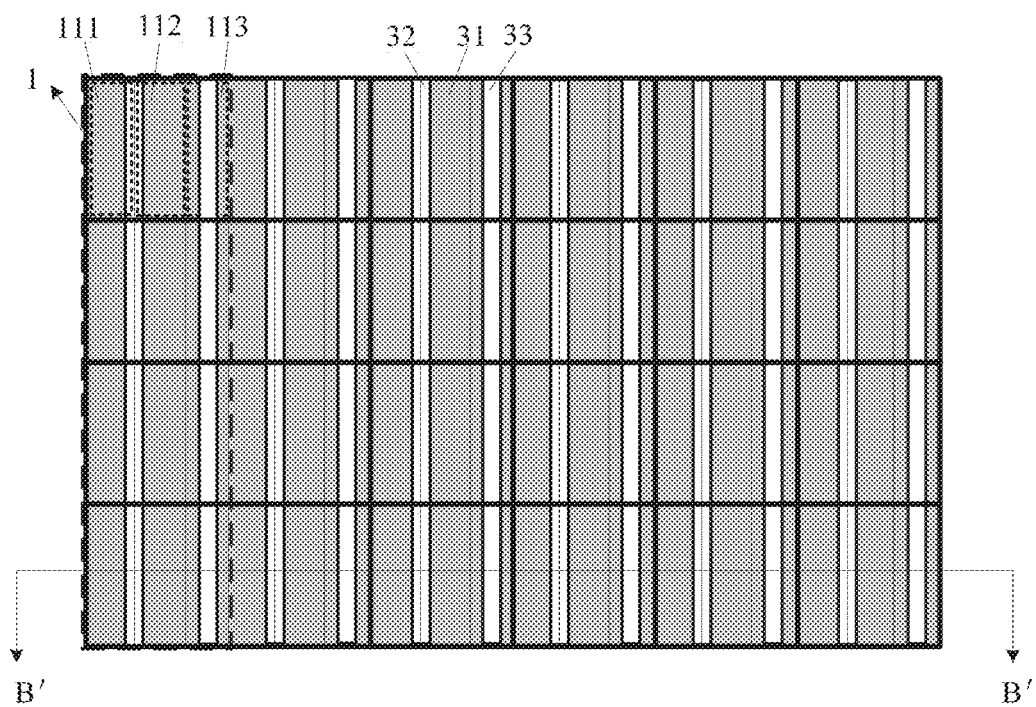
FIG. 6(a) is a structural diagram of a tri view display device provided in some embodiments of the present disclosure.
Figures 6B, 7:
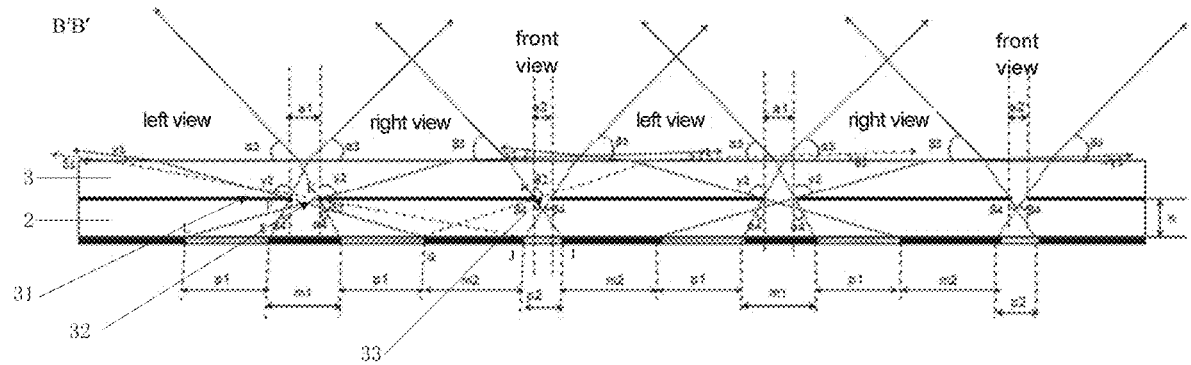
FIG. 6(b) is an optical path diagram corresponding to the cross-sectional view in an B'B' direction in FIG. 6(a)
FIG. 7 is a flowchart of a display method of a display device provided in some embodiments of the present disclosure.

It should be noted that, the display panel 2 in FIGS. 5(b) and 6(b) is not completely illustrated, and only a display substrate adjacent to the grating 3 of the display panel 2 is illustrated.

Here, a type of the grating 3 is not limited. For example, it may be a black matrix grating, a liquid crystal grating, an electroluminescent grating, or the like.

Based on the above, it is not limited specific positions of the light shielding region 31 and the light transmitting region 32 of the grating 3 corresponding to specific position of the display panel 2. It may be the same as that in the prior art, and it is unnecessary to go into details here.

The display device provided in the embodiments of the present disclosure may be any device which displays a dynamic image (for example, video) or a static image (for example, a still image), or may be any device which displays an image as a text or an image as a picture. More specifically, it is contemplated that the embodiments may be implemented in or associated with a variety of electronic devices such as, but not limited to, mobile phones, wireless devices, personal data assistants (PDAs), hand-held computers, portable computers, GPS receivers/navigators, cameras, MP4 video players, camcorders, game consoles, watches, clocks, calculators, TV monitors, flat panel displays, computer monitors, car displays (e.g., odometer displays, etc.), navigators, cockpit controllers and/or monitors, displays of camera views (e.g., displays of rear-view cameras in vehicles), electronic photographs, electronic billboards or signs, projectors, building structures, packaging and aesthetic structures (e.g., displays for a piece of jewelry) and so on.

The embodiments of the present disclosure provide the display device. Since the display substrate of the display device includes a plurality of display groups 1 arranged along a row direction, wherein each of the plurality of display groups 1 includes n columns of pixel units 10 of different views, and for each pixel unit of the n columns of pixel units of different views, a ratio of a length a along the row direction X to a length b along a column direction Y is 1/n, and the length of each of the pixel units 10 of a common display substrate along the row direction X is equal to the length of each of the pixel units 10 of the common display substrate along the column direction Y. Therefore, for the display substrate and the common display substrate which are having the same size, the length of each of the plurality of display groups 1 along the row direction X is equal to the length of each of the pixel units 10 of the common display substrate along the row direction X. In this way, along the row direction X, a number of the plurality of display groups 1 that can be set on the display substrate is equal to a number of the pixel units 10 that can be set on the common display substrate. That is, in the embodiment of the disclosure, the number of the pixel units 10 of each of the different views along the row direction X is equal to the number of the pixel units 10 of the common display substrate along the row direction X. Thus, if the image information of the common display panel is input to one of the pixel units 10 of any one of the different views, no distortion will occur in the displayed image, and the resolution of the displayed image will not reduce.

Optionally, as shown in FIG. 5(a) and FIG. 5(b), when n is 2, each of a plurality of display groups 1 corresponds to one of the light transmitting regions 32 of the grating 3, and the one of the light transmitting regions 32 is located at a boundary position between one column of left view pixel units 111 and one column of right view pixel units 112.

In one of the plurality of display groups 1, the one of the light transmitting regions 32 is located at the boundary position between the one column of left view pixel units 111 and one column of right view pixel units 112 may be that, an orthographic projection of a centerline of the one of the light transmitting regions 32 along the column direction Y on the display panel 2 is overlapped with an orthographic projection of a centerline of the one of the plurality of display groups 1 of the display panel along the column direction Y on the display panel 2. In addition, in the one of the plurality of display groups 1, the one of the light transmitting regions 32 is located at the boundary position between the one column of left view pixel units 111 and one column of right view pixel units 112 may also be that, the orthographic projection of the centerline of the one of the light transmitting regions 32 along the column direction Y on the display panel 2 is not overlapped with the orthographic projection of the centerline of the one of the plurality of display groups 1 of the display panel along the column direction Y on the display panel 2. That is, the orthographic projection of the centerline of the one of the light transmitting regions 32 along the column direction Y on the display panel 2 is offset to left or to right with respect to the orthographic projection of the centerline of the one of the plurality of display groups 1 of the display panel along the column direction Y on the display panel 2. Here, an offset value should be controlled within a reasonable range so as to not affect a normal display of the dual view display device.

In the embodiments of the present disclosure, when n is 2, one of the plurality of display groups 1 corresponds to one of the light transmitting regions 32 of the grating 3, and the one of the light transmitting regions 32 is located at the boundary position between one of the one column of left view pixel units 111 and one of the one column of right view pixel units 112. Therefore, a light emitted by the one of the one column of left view pixel units 111 and a light emitted by the one of the one column of right view pixel units 112 may both be emitted through the one of the light transmitting regions 32, so that a dual view display may be realized.

Further optionally, as shown in FIGS. 5(a) and 5(b), the one of the light transmitting regions 32 is located at a middle position of one of the plurality of display groups 1, and along the column direction Y, the orthogonal projection of the centerline of the one of the light transmitting regions 32 on the display panel 2 is overlapped with the orthogonal projection of the centerline of the one of the plurality of display groups 1 on the display panel 2; and a viewing angle $\varphi_0$ of a left view and a right view meets a formula of:

$$90° - \arcsin\left\{n_0 \times \sin\left[\arctan\left(\frac{3m+2p-a}{2h}\right)\right]\right\} <$$

$$\varphi_0 < 90° - \arcsin\left\{n_0 \times \sin\left[\arctan\left(\frac{a-m}{2h}\right)\right]\right\};$$

In the above formula, a is a length of the one of the light transmitting regions 32 along the row direction Y, p is a length of an aperture region 101 of a pixel unit 10 along the row direction Y, and m is a length between two adjacent aperture regions 101 along the row direction Y. h is a thickness of a base substrate adjacent to the grating 3 of the display panel 2, and $n_0$ is a refractive index of the base substrate adjacent to the grating 3 of the display panel 2.

It should be noted that, the base substrate adjacent to the grating 3 of the display panel 2 is not limited. The base substrate may be a base substrate in an array substrate, or may be a base substrate in a color film substrate upon the display panel 2 is an LCD display panel; and the base substrate may be a base substrate in the array substrate, or may also be a base substrate in a encapsulation substrate upon the display panel 2 is an OLED display panel. Based on this, the base substrate may be a glass substrate or a light transmitting material layer in a deposited state.

An optical path diagram of a dual view display device is shown in FIG. 5(b). A following formula may be obtained according to laws of refraction and geometric relations:

$$n_0 \times \sin\alpha_2 = \sin(90° - \alpha_1) \quad (1)$$

$$\tan\alpha_2 = \frac{a-m}{2h} \quad (2)$$

a following formula may be obtained according to the formulas (1) and (2):

$$\alpha_1 = 90° - \arcsin\left\{n_0 \times \sin\left[\arctan\left(\frac{a-m}{2h}\right)\right]\right\};$$

FIG. 5(b) is a cross-sectional view taken along the line A'A' of FIG. 5(a). As shown in FIG. 5(b), a non-aperture region between a left view aperture region and a right view aperture region in one of the plurality of display groups 1 of the display substrate is a first non-aperture region; and a non-aperture region between a left view aperture region and an adjacent right view aperture region which are in different display groups of the plurality of display groups 1 of the display substrate is a second non-aperture region. Point B is an intersection point between the right view aperture region and the first non-aperture region in the one of the plurality of display groups. Point is an intersection point between the second non-aperture region and its adjacent left view aperture region. Point C is an intersection point between one of the light transmitting regions 32 of a grating of the dual view and one of the light shielding regions 31 adjacent to a side of the right view aperture region of the one of the plurality of the display groups 1. $\alpha_2$ is an angle between a BC line and a normal line perpendicular to the display panel 2, and $\alpha_1$ is a remaining angle of a refraction angle when a light whose incident angle is $\alpha_2$ is emitted from the display device to air.

A following formula may be obtained according to the laws of refraction and the geometric relations:

$$n_0 \times \sin\beta_2 = \sin(90° - \beta_1) \quad (3)$$

$$\tan\beta_2 = \frac{3m + 2p - a}{2h} \quad (4)$$

A following formula may be obtained according to the formulas (3) and (4):

$$\beta_1 = 90° - \arcsin\left\{n_0 \times \sin\left[\arctan\left(\frac{3m + 2p - a}{2h}\right)\right]\right\};$$

As shown in FIG. 5(*b*), $\beta_2$ is an angle between a CD line and the normal line perpendicular to the display panel 2, and $\beta_1$ is a remaining angle of a refraction angle when a light whose incident angle is $\beta_2$ is emitted from the display device to air.

Here, according to FIG. 5(*b*), when the viewing angle $\varphi_0$ of the left view and the right view meets: $\beta_1 < \varphi_0 < \alpha_1$, there does not exist crosstalk regions in both the left view and the right view.

In the embodiments of the present disclosure, since one of the light transmitting regions 32 is located at the middle position of one of the plurality of display groups 1, and along the column direction Y, the orthogonal projection of the centerline of the one of the light transmitting region 32 on the display panel 2 is overlapped with the orthogonal projection of the centerline of the one of the plurality of the display groups 1 on the display panel 2; and the viewing angle $\varphi_0$ of the left view and the right view meets a formula of:

When $\beta_1 < \varphi_0 < \alpha_1$, that is, $$90° - \arcsin\left\{n_0 \times \sin\left[\arctan\left(\frac{3m + 2p - a}{2h}\right)\right]\right\} <$$

$$\varphi_0 < 90° - \arcsin\left\{n_0 \times \sin\left[\arctan\left(\frac{a - m}{2h}\right)\right]\right\},$$

there does not exist the crosstalk regions in both the left view and the right view.

Optionally, as shown in FIG. 6(*a*) and FIG. 6(*b*), when n is 3, one light transmitting region 32 of two adjacent light transmitting regions of the light transmitting regions 32 is located at a boundary position between the one column of left view pixel units 111 and the one column of right view pixel units 112, and another light transmitting region 33 of the two adjacent light transmitting regions of the light transmitting regions 32 is located at a middle position of one column of front view pixel unit 113.

The one light transmitting region 32 is located at the boundary position between the one column of left view pixel units 111 and the one column of right view pixel units 112 may be that, an orthographic projection of a centerline of the one light transmitting region 32 along the column direction Y on the display panel 2 is overlapped with an orthographic projection of a centerline of the one column of left view pixel unit 111 and the one column of right view pixel unit 112 along the column direction Y on the display panel 2. In addition, the one light transmitting region 32 is located at the boundary position between the one column of left view pixel units 111 and the one column of right view pixel units 112 may be also that, the orthographic projection of the centerline of the one light transmitting region 32 along the column direction Y on the display panel 2 is overlapped with the orthographic projection of the centerline of the one column of left view pixel unit 111 and the one column of right view pixel unit 112 along the column direction Y on the display panel 2. That is, the orthographic projection of the centerline of the one light transmitting region 32 along the column direction Y on the display panel 2 is offset to left or to right with respect to the orthographic projection of the centerline of the region composed with the one column of left view pixel unit 111 and the one column of right view pixel unit 112 along the column direction Y on the display panel 2. Here, an offset value should be controlled within a reasonable range so as to not affect a normal display of a tri view display device.

The another light transmitting region 33 is located at the middle position of the one column of front view pixel units 113 may be that, an orthographic projection of a centerline of the another light transmitting region 33 along the column direction Y on the display panel 2 is overlapped with an orthographic projection of a centerline of the one column of front view pixel units 113 along the column direction Y on the display panel 2. In addition, the another light transmitting region 33 is located at the middle position of the one column of front view pixel units 113 may also be that, the orthographic projection of the centerline of the another light transmitting region 33 along the column direction Y on the display panel 2 is not overlapped with the orthographic projection of the centerline of the one column of front view pixel units 113 along the column direction Y on the display panel 2. However, an offset value between the orthographic projection of the centerline of the another light transmitting region 33 along the column direction Y on the display panel 2 and the orthographic projection of the centerline of the one column of front view pixel units 113 along the column direction Y on the display panel 2 should be controlled within the reasonable range to ensure that the normal display of the tri view display device may be realized.

According to the embodiments of the present disclosure, since the one light transmitting region 32 of the two adjacent light transmitting regions of the light transmitting regions is located at the boundary position between the one column of left view pixel units 111 and the right view pixel units 112, a light emitted by the one column of left view pixel units 111 and a light emitted by the one column of right view pixel units 112 may be emitted through the light transmitting regions 32. And since the another light transmitting region 33 of the two adjacent light transmitting regions of the light transmitting regions is located at the middle position of the one column of front view pixel units 113. A light emitted by the one column of front view pixel units 113 may be emitted through the light transmitting region 33, so that a tri view display may be realized.

Further optionally, as shown in FIG. 6(b), an orthographic projection of the centerline of the one light transmitting region 32 of the two adjacent light transmitting regions of the light transmitting regions 32 along the column direction Y on the display panel 2 is overlapped with an orthographic projection of the centerline of the one column of left view pixel unit 111 and the one column of right view pixel unit 112 along the column direction Y on the display panel 2, and an orthogonal projection of the centerline of the another light transmitting region 32 of the two adjacent light transmitting regions of the light transmitting regions 32 along the column direction Y is overlapped with an orthogonal projection of the centerline of the one column of front view pixel unit 113 along the column direction Y on the display panel 2.

A viewing angle $\varphi_1$ of the left view and the right view meets a formula of:

$$90° - \arcsin\left\{n_0 \times \sin\left[\arctan\left(\frac{2p_1 + m_1 + a_1}{2h}\right)\right]\right\} <$$
$$\varphi_1 < 90° - \arcsin\left\{n_0 \times \sin\left[\arctan\left(\frac{m_1 - a_1}{2h}\right)\right]\right\};$$

in the above formula:

$$\frac{2m_2 + p_2 - a_2}{2h} \geq \tan\left[\arcsin\left(\frac{1}{n_0}\right)\right],$$
$$\frac{2m_2 + 2p_1 + m_1 - a_1}{2h} \geq \tan\left[\arcsin\left(\frac{1}{n_0}\right)\right],$$

and $m_1 - a_1 - p_2 - a_2 \geq 0$, where $p_1$ is a length of an aperture region 101 of one left view pixel unit 111 of the one column of left view pixel units or one right view pixel unit 112 of the one column of right view pixel units along the row direction X, $p_2$ is a length of an aperture region 101 of one front view pixel unit 113 of the one column of front view pixel units, $m_1$ is a length between an aperture region 101 of the one left view pixel unit 111 of the one column of left view pixel units and an aperture region 101 of the one right view pixel unit 112 of the one column of right view pixel units along the row direction X, wherein the one left view pixel unit 111 of the one column of left view pixel units is adjacent to the one right view pixel unit 112 of the one column of right view pixel units; $m_2$ is a length between an aperture region 101 of the one left view pixel unit 111 of the one column of left view pixel units and an aperture region 101 of the one front view pixel unit 113 of the one column of front view pixel units along the row direction X, wherein the one left view pixel unit 111 is adjacent to the one front view pixel unit 113, or $m_2$ is a length between an aperture region 101 of the one right view pixel unit 112 of the one column of right view pixel units and an aperture region 101 of the one front view pixel unit 113 of the one column of front view pixel units along the row direction X, wherein the one right view pixel unit 112 is adjacent to the front view pixel unit 113; $a_1$ is a length of the one light transmitting region 32 along the row direction X at the boundary position between the one column of left view pixel units 111 and the one column of right view pixel units 112, and $a_2$ is a length of the another light transmitting region 33 along the row direction X at the middle position of the one front view pixel unit 113 of the one column of front view pixel units; h is a thickness of the base substrate adjacent to the grating 3 of the display panel 2, and $n_0$ is a refraction rate of the base substrate adjacent to the grating 3 of the display panel 2.

It should be noted that the base substrate adjacent to the grating 3 of the display panel 2 is not limited. The base substrate may be a base substrate in an array substrate, or may be a base substrate in a color film substrate upon the display panel 2 is an LCD display panel; and the base substrate may be a base substrate in the array substrate, or may also be a base substrate in a encapsulation substrate upon the display panel 2 is an OLED display panel. Based on this, the base substrate may be a glass substrate or a light transmitting material layer in a deposited state.

An optical path diagram of a tri view display device is shown in FIG. 6(b). A following formula may be obtained according to laws of refraction and geometric relations:

$$n_0 \times \sin\alpha_4 = \sin(90° - \alpha_3) \quad (5)$$

$$\tan\alpha_4 = \frac{m_1 - a_1}{2h} \quad (6)$$

a following formula may be obtained according to the formulas (5) and (6):

$$\alpha_3 = 90° - \arcsin\left\{n_0 \times \sin\left[\arctan\left(\frac{m_1 - a_1}{2h}\right)\right]\right\}$$

FIG. 6(b) is a cross-sectional view taken along the line B'B' of FIG. 6(a). As shown in FIG. 6(b), in one of the plurality of display groups 1, a non-aperture region between a left view aperture region and a right view aperture region is a first non-aperture region; a non-aperture region between the left view aperture region and a front view aperture region is a second non-aperture region; and a non-aperture region between the front view aperture region and the right view aperture region adjacent thereto is a third non-aperture light region (here, the front view aperture region and the right view aperture region are located in adjacent display groups of the plurality of display groups 1). Point E is an intersection point between the right view aperture region and the first non-aperture region. Point F is an intersection point between the light transmitting region 32 of the above display group and a light shielding region 31 located at a left side thereof. Point H is an intersection point between the light transmitting region 33 and the left light shielding region 31 located at a left side thereof of one of the plurality of display groups described above. Point G is an intersection point between the left view aperture region and the second non-aperture region. Point I is an intersection point between the front view aperture region and the third non-aperture region. Point J is an intersection point between the second non-aperture region and the front view aperture region. Point K is an intersection point between the light transmitting region 32 and a light shielding region 31 on a right side thereof of one of the plurality of display groups described above. Point L is an intersection point between the right view aperture region and the third non-aperture region of one of the plurality of display groups described above. $\alpha_4$ is an angle between a EF line and a normal line perpendicular to the display panel 2, and $\alpha_3$ is a remaining angle of a refraction angle when a light whose incident angle is $\alpha_4$ is emitted from the display device to air.

A following formula may be obtained according to the laws of refraction and the geometric relations:

$$n_0 \times \sin\beta_4 = \sin(90° - \beta_3) \quad (7)$$

$$\tan\beta_4 = \frac{p_2 + a_2}{2h} \quad (8)$$

A following formula may be obtained according to the formulas (7) and (8):

$$\beta_3 = 90° - \arcsin\left\{n_0 \times \sin\left[\arctan\left(\frac{p_2 + a_2}{2h}\right)\right]\right\}$$

where, $\beta_4$ is an angle between a HI line and the normal line perpendicular to the display panel 2, and $\beta_3$ is a remaining angle of a refraction angle when a light whose incident angle is $\beta_4$ is emitted from the display device to the air.

A following formula may be obtained according to the laws of refraction and the geometric relations:

$$n_0 \times \sin\gamma_2 = \sin(90° - \gamma_1) \quad (9)$$

$$\tan\gamma_2 = \frac{2p_1 + m_1 + a_1}{2h} \quad (10)$$

A following formula may be obtained according to the formulas (9) and (10):

$$\gamma_1 = 90° - \arcsin\left\{n_0 \times \sin\left[\arctan\left(\frac{2p_1 + m_1 + a_1}{2h}\right)\right]\right\}$$

where, $\gamma_2$ is an angle between a JK line and the normal line perpendicular to the display panel 2, and $\gamma_1$ is a remaining angle of a refraction angle when a light whose incident angle is $\gamma_2$ is emitted from the display device to the air.

A following formula may be obtained according to the laws of refraction and the geometric relations:

$$n_0 \times \sin\theta_2 = \sin(90° - \theta_1) \quad (11)$$

$$\tan\theta_2 = \frac{2m_2 + p_2 - a_2}{2h} \quad (12)$$

where, $\theta_2$ is the angle between the HG line and the normal line perpendicular to the display panel 2, and $\theta_1$ is the remaining angle of the refraction angle when a light whose incident angle is $\theta_2$ is emitted from the display device to the air.

According to the laws of refraction and the geometric relations, a following formula may be obtained:

$$n_0 \times \sin\delta_2 = \sin(90° - \delta_1) \quad (13)$$

$$\tan\delta_2 = \frac{2m_2 + 2p_1 + m_1 - a_1}{2h} \quad (14)$$

where, $\delta_2$ is an angle between a JK line and the normal line perpendicular to the display panel 2, and $\delta_1$ is a remaining angle of a refraction angle when a light whose incident angle is $\delta_2$ is emitted from the display device to the air.

According to FIG. 6(*b*), when $\theta_1=0°$, $\delta_1=0°$ and $\beta_3 \geqslant \alpha_3$, the viewing angle $\varphi_1$ of the left view and the right view meets: $\alpha_3 < \varphi_1 < \gamma_1$, there does not exist crosstalk regions in the left view, the front view and the right view.

According to the formula (11), when, a critical angle of $\theta_1=0°$ is $$\arcsin\left(\frac{1}{n_0}\right),$$

when the incident angle is greater than the critical angle, it is able to make $\theta_1=0°$, so that $$\arctan\left(\frac{2m_2 + p_2 - a_2}{2h}\right) \geq \arcsin\left(\frac{1}{n_0}\right). \quad (15)$$

$$\text{That is, } \frac{2m_2 + p_2 - a_2}{2h} \geq \tan\left[\arcsin\left(\frac{1}{n_0}\right)\right]$$

According to the formula (13), a critical angle of $\delta_3=0°$ is $$\arcsin\left(\frac{1}{n_0}\right),$$

when the incident angle is greater than the critical angle, it is able to make $\delta_1=0°$ so that $$\arctan\left(\frac{2m_2 + 2p_1 + m_1 - a_1}{2h}\right) \geq \arcsin\left(\frac{1}{n_0}\right). \quad (16)$$

$$\text{That is, } \frac{2m_2 + 2p_1 + m_1 - a_1}{2h} \geq \tan\left[\arcsin\left(\frac{1}{n_0}\right)\right]$$

$$\beta_3 \geq \alpha_3, \text{ so that } 90° - \arcsin\left\{n_0 \times \sin\left[\arctan\left(\frac{p_2 + a_2}{2h}\right)\right]\right\} \geq \quad (17)$$

$$90° - \arcsin\left\{n_0 \times \sin\left[\arctan\left(\frac{m_1 - a_1}{2h}\right)\right]\right\}$$

i.e., $m_1 - a_1 - p_2 - a_2 \geq 0$

Based on the above, according to the embodiments of the present disclosure, when $$\frac{2m_2 + p_2 - a_2}{2h} \geq \tan\left[\arcsin\left(\frac{1}{n_0}\right)\right], \frac{2m_2 + 2p_1 + m_1 - a_1}{2h} \geq \tan\left[\arcsin\left(\frac{1}{n_0}\right)\right],$$

and $m_1 - a_1 - p_2 - a_2 \geqslant 0$, the viewing angle $\varphi_1$ of the left view and the right view meets:

when $$90° - \arcsin\left\{n_0 \times \sin\left[\arctan\left(\frac{2p_1 + m_1 + a_1}{2h}\right)\right]\right\} <$$

$$\varphi_1 < 90° - \arcsin\left\{n_0 \times \sin\left[\arctan\left(\frac{m_1 - a_1}{2h}\right)\right]\right\},$$

there does not exist the crosstalk regions in the left view, the front view and the right view, so that the display effect of the tri view display device may be improved.

Based on this, when $\gamma_1=0°$ and the viewing angle $\varphi_1$ of the left view and the right view is $\alpha_3$, there does not exist the crosstalk regions in entire views. Specifically, according to the formula (9), the critical angle of $\gamma_1=0°$ is $$\arcsin\left(\frac{1}{n_0}\right),$$

and when the incident angle is greater than the critical angle, $\gamma_1$ may be made to be 0°, so that $$\arctan\left(\frac{2p_1+m_1+a_1}{2h}\right) \geq \arcsin\left(\frac{1}{n_0}\right).$$

That is, $\frac{2p_1+m_1+a_1}{2h} \geq \tan\left[\arcsin\left(\frac{1}{n_0}\right)\right]$ Based on the above, when $$\frac{2p_1+m_1+a_1}{2h} \geq \tan\left[\arcsin\left(\frac{1}{n_0}\right)\right],$$

and the viewing angle $\varphi_1$ of the left view and the right view is $$90° - \arcsin\left\{n_0 \times \sin\left[\arctan\left(\frac{m_1-a_1}{2h}\right)\right]\right\},$$

there does not exist the crosstalk regions in the entire views, and the display effect of the tri view display device may be improved.

Some embodiments of the present disclosure further provide a display method of the display device above. As shown in FIG. 7, the device above includes the following steps 100~101 (S100~S101).

In S100, image information of an image to be displayed is acquired, wherein the image information includes image data of n views.

Here, the image data of n views is composed of M×(n·N) columns upon the image data of each of the n views is composed of M×N columns.

In S101, the image data of n views is correspondingly input to n columns of pixel units 10 of the display device.

Here, the image data of one view of the n views is correspondingly input to one pixel unit 10 of the n columns of pixel units 10 corresponding to the one view of the n views, so that the one pixel unit 10 of the n columns of pixel units 10 corresponding to the one view of the n views displays a corresponding image.

Figure 8:
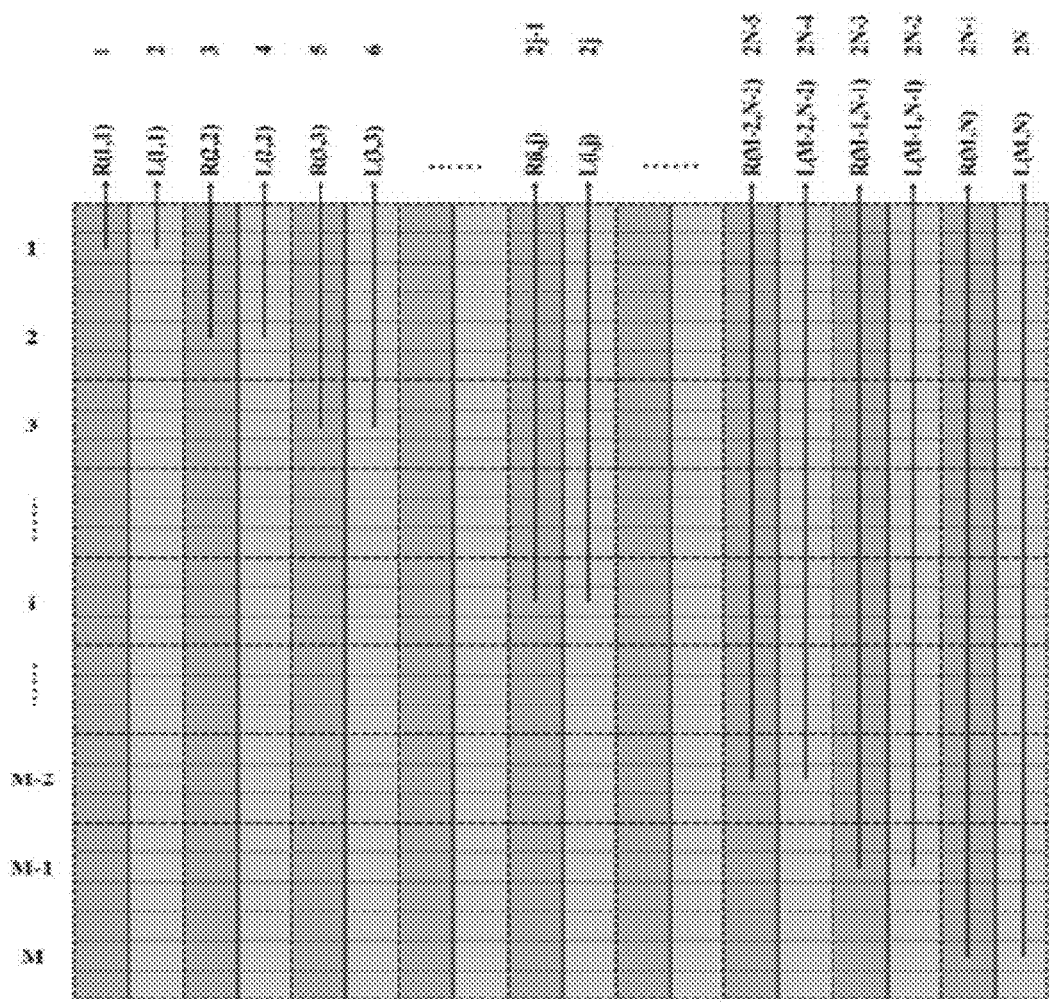
FIG. 8(a) is a diagram of image information corresponding to a dual view display device provided in some embodiments of the present disclosure.
FIG. 8(b) is a diagram of image information corresponding to a tri view display device provided in some embodiments of the present disclosure.
Figure 8:
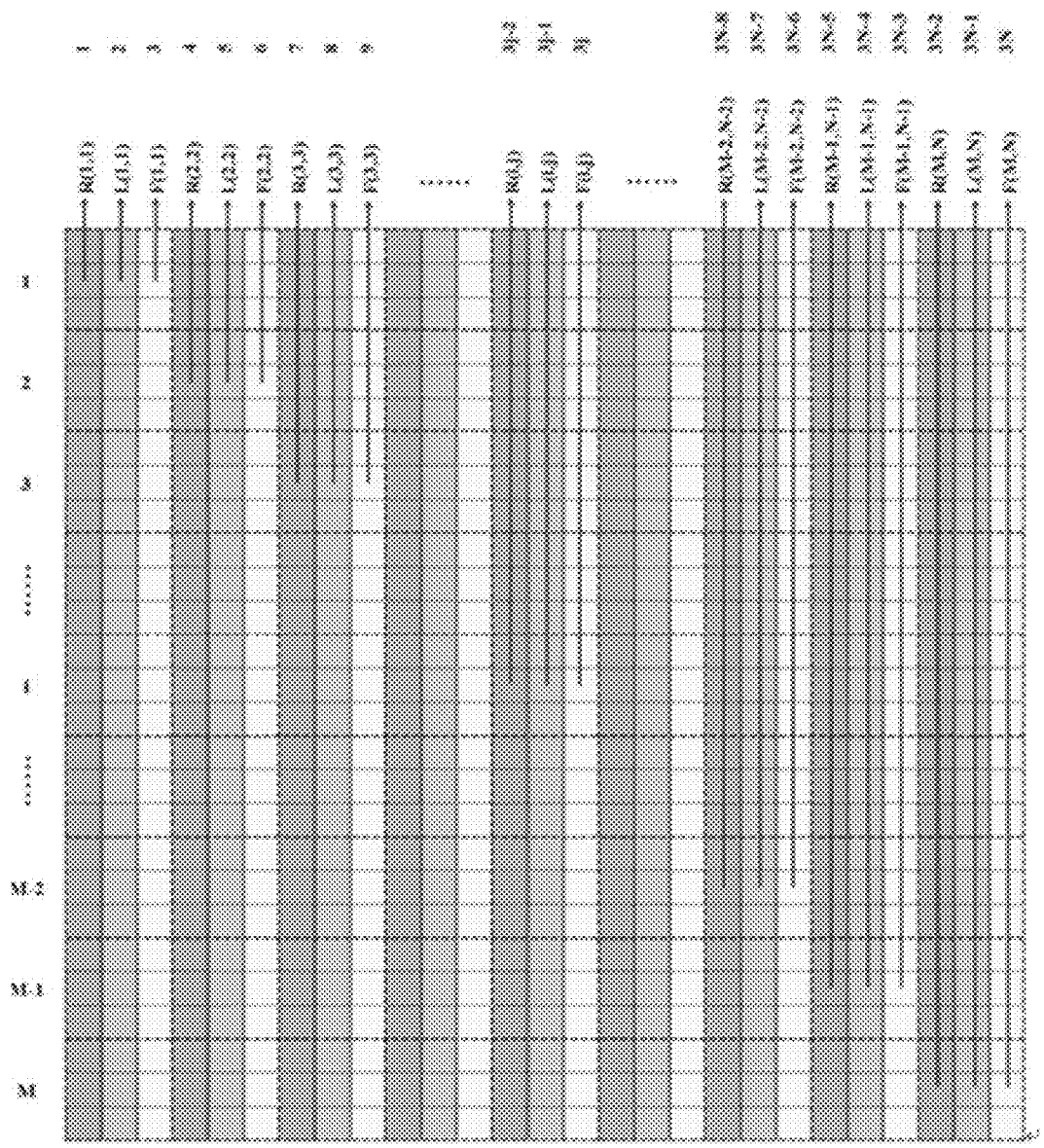

Illustratively, it takes the image information including an image data of two views as an example. As shown in FIG. 8(a), image information of a dual view display is composed of M×2N columns, wherein odd-numbered columns of the image information correspond to image data of an image of a right view, and even-numbered columns of the image information correspond to an image data of an image of a left view. The image data of the image of the left view and the image data of the image of the right view are combined sequentially and alternately to synthesize the image information of the dual view display. The image information of the M×2N columns of the dual view display is input into a left view pixel unit 111 and a right view pixel unit 112 of a dual view display device correspondingly (each row of the dual view display device includes N display groups 1, and each of the N display groups 1 includes one column of left view pixel units 111 and one column of right view pixel units 112). Since image data of each view is composed of M×N columns, images displayed of the right view and the left view have no distortion and it is able to maintain their native resolution (M×N) without reducing the resolution.

For another example, it takes the image information including an image data of three views as an example. As shown in FIG. 8(b), image information of a tri view display is composed of M×3N columns, 3j−2 columns of the image information correspond to data information of an image of a right view, 3j−1 columns of the image information correspond to data information of an image of a left view, and 3j columns of the image information correspond to data information of an image of a front view, wherein $1 \leq j \leq N$. The data information of the image of the left view, the data information of the image of the front view and the data information of the image of the right view are combined sequentially and alternately to synthesize frame data information of display images of tri view. The image information of display images of the M×3N columns of the tri view is correspondingly input into the left view pixel units 111, the right view pixel units 112 and front view pixel units 113 of a tri view display device (each row of the tri view display device includes N display groups 1, and each of the N display groups 1 includes one column of left view pixel units 111, one column of right view pixel units 112 and one column of front view pixel units 113). Since image data of each view is composed of M×N columns, images displayed of the right view and the left view have no distortion and it is able to maintain their native resolution (M×N) without reducing the resolution.

The embodiments of the present disclosure provide the display method of the above-mentioned display device. The image data of one view of the n views is correspondingly input to one pixel units 10 of the n columns of pixel units 10 corresponding to the one view of the n views of the display device. Since the image data of each of the n views may be input into one pixel unit 10 of the n columns of pixel units 10 corresponding to the one view of the n views in one-to-one correspondence, images displayed in each of the n views will not be distorted, and the resolution of displayed images will not reduce.

The foregoing descriptions are merely specific implementation manners of the present disclosure, but the protection scope of the present disclosure is not limited thereto. Any person skilled in the art may easily think of the change or the replacement within the technical scope disclosed in the present disclosure, which should be within the scope of the disclosure. Therefore, the protection scope of the present disclosure should be based on the protection scope of the claims.

What is claimed is:

1. A display device, comprising:
 a display panel including a display substrate, wherein the display substrate includes a plurality of display groups arranged one by one along a row direction; and
 a grating disposed on a light emitting side of the display panel, wherein the grating comprises light-shielding regions and light transmitting regions which are sequentially and alternately arranged along the row direction, wherein
 each display group of the plurality of display groups includes one column of left view pixel units and one column of right view pixel units, the display group corresponds to one of the light transmitting regions of the grating, and the one of the light transmitting regions is located at a boundary position between the one column of left view pixel units and the one column of right view pixel units, wherein for each left view pixel unit of the one column of left view pixel units, a ratio of a length along the row direction to a length along a column direction is ½, and for each right view pixel unit in one column of the right view pixel units, a ratio of a length along the row direction to a length along the column direction is ½; and the one of the light transmitting regions is located at a middle position of the display group, and along the column direction, an orthogonal projection of a centerline of the one of the light transmitting regions on the display panel is overlapped with an orthogonal projection of a centerline of the display group on the display panel; and a viewing angle $\varphi_0$ of a left view and a right view meets a formula of:

$$90° - \arcsin\left\{n_0 \times \sin\left[\arctan\left(\frac{3m+2p-a}{2h}\right)\right]\right\} <$$
$$\varphi_0 < 90° - \arcsin\left\{n_0 \times \sin\left[\arctan\left(\frac{a-m}{2h}\right)\right]\right\};$$

where, "a" is a length of the one of the light transmitting regions along the row direction, "p" is a length of an aperture region of a pixel unit along the row direction, "m" is a length between two adjacent aperture regions along the row direction, "h" is a thickness of a base substrate of the display panel adjacent to the grating, and "no" is a refractive index of the base substrate of the display panel adjacent to the grating.

2. A display method of the display device according to claim 1, comprising:

acquiring image information of an image which is to be displayed, wherein the image information comprises image data of n views; and inputting the image data of the n views correspondingly into n columns of pixel units of different views of the display device.

3. The display device according to claim 1, wherein the display panel is a liquid crystal display panel or an organic light-emitting diode display panel.

4. The display device according to claim 1, wherein the grating is a black matrix grating, a liquid crystal grating or an electroluminescent grating.

5. The display device according to claim 1, wherein each pixel unit of the one column of left view pixel units and the one column of right view pixel units includes a first primary color sub-pixel unit, a second primary color sub-pixel unit and a third primary color sub-pixel unit which are sequentially arranged along the column direction, wherein, colors of a same row of sub-pixel units of each of the plurality of display groups are the same.

* * * * *